(12) United States Patent
Barnes

(10) Patent No.: US 10,585,455 B1
(45) Date of Patent: Mar. 10, 2020

(54) DOCKING CRADLE FOR A HANDHELD COMPUTING DEVICE HAVING MULTIPLE MOUNTING ORIENTATIONS

(71) Applicant: Panasonic Avionics Corporation, Lake Forest, CA (US)

(72) Inventor: Andrew Barnes, Mission Viejo, CA (US)

(73) Assignee: PANASONIC AVIONICS CORPORATION, Lake Forest, CA (US)

( * ) Notice: Subject to any disclaimer, the term of this patent is extended or adjusted under 35 U.S.C. 154(b) by 0 days.

(21) Appl. No.: 16/392,181

(22) Filed: Apr. 23, 2019

(51) Int. Cl.
*H05K 5/00* (2006.01)
*G06F 1/16* (2006.01)
*H05K 5/02* (2006.01)

(52) U.S. Cl.
CPC ......... *G06F 1/1632* (2013.01); *H05K 5/0008* (2013.01); *H05K 5/0069* (2013.01); *H05K 5/0204* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 6,229,893 B1 * | 5/2001 | Chen | B60R 11/0241 379/446 |
| 9,584,846 B2 | 2/2017 | Bleacher et al. | |
| 2014/0053185 A1 | 2/2014 | Bleacher et al. | |
| 2016/0236493 A1 * | 8/2016 | Lyman | B41J 29/023 |

* cited by examiner

*Primary Examiner* — Jerry Wu
(74) *Attorney, Agent, or Firm* — Vista IP Law Group LLP

(57) ABSTRACT

A docking cradle for a handheld computing device, such as a handheld controller, remote control, tablet computer, smartphone or other electronic device. The docking cradle is configured to be mountable to a horizontal mounting surface (e.g., a table or other horizontal surface), or a vertical mounting surface (e.g., a seatback or wall), while in either mounting orientation, the docking cradle holds the computing device in substantially the same orientation for convenient use and access by a user.

19 Claims, 13 Drawing Sheets

DOCKING CRADLE FOR A HANDHELD COMPUTING DEVICE HAVING MULTIPLE MOUNTING ORIENTATIONS

BACKGROUND

The field of the invention generally relates to docking cradles for handheld computing devices, and more particularly, to a docking cradle for a handheld computing device which can mount to a vertical mounting surface or a horizontal mounting surface in which the computing device is in the same orientation.

Many vehicles of common carriers, such as airplanes, passenger trains, buses, cruise ships, and the like, have individualized functional equipment dedicated to a particular passenger seat which can be utilized by the passenger, such as video and/or audio entertainment systems, adjustable seats, adjustable environmental controls, adjustable lighting, telephony systems, crew communication systems, and the like. For example, many commercial airplanes have individualized video and audio entertainment systems, often referred to as "in-flight entertainment" or "IFE" systems.

As one example of a passenger seat function, the entertainment systems (e.g., an IFE system) for passenger carrier vehicles, such as commercial airlines, often include in-seat video display units installed at each passenger seat. For instance, video display units may be mounted at each of the seatbacks of the passenger seats. The entertainment system includes a centralized entertainment system server which is networked to each of the video display units via a communication network. The entertainment system server distributes media content (e.g., videos, audio, movies, television shows, etc.) to each of the video display units. Generally, the entertainment system allows each passenger to select from multiple video channels and/or audio channels, or even individually select and play videos and/or audio from a library of videos and audio content. The video displays may also provide games, communication applications (e.g., telephone service, messaging, etc.), internet browsing, and other computer applications. In some systems, the video displays may be smart monitors which can run computer applications and process and store data internally.

To operate the seat functions, such as the video display system, environmental controls, seat adjustment, etc., controls are provided on or near the passenger seat that allow the passenger to control the seat functions. The controls may be physical buttons, or on-screen interfaces displayed, for instance, on a touchscreen of the video display unit, or on a separate controller having a touchscreen display. For example, some commercial airplane entertainment systems have on-screen interfaces for controlling a reading light, activating a crew member call signal, as well as controlling the audio/video entertainment. Some systems utilize a tethered handheld controller which is connected via a cable to the video display unit or to an arm rest of the passenger seat. The cable electrically connects the handheld controller to the video display unit and also physically connects the controller to the seat location. Tethering of the handheld controller allows a passenger to conveniently hold the controller for controlling the seat functions, while also preventing the controller from being removed by the passenger from the particular seat, or from the vehicle itself. However, tethering the controller also has a number of shortcomings. The tethering cable can be a nuisance which interferes with the ingress/egress of adjacent passengers and access to a seat-back tray or other articles in and around the seat, and also limits the range in which the controller can be located such as when a passenger reclines a seat or moves further from the tethered location.

In order to overcome some of the drawbacks of tethered handheld controllers, wireless handheld controllers have been disclosed. For example, U.S. Pat. No. 9,584,846, discloses a docking cradle for holding and locking a wireless, handheld controller in the cradle. The controller has a form factor similar to a mobile phone. The docking cradle has a recessed area for receiving and holding the controller. The cradle has a locking tab which retains the controller in the cradle. The locking tab is coupled to a manually actuated button to actuate the locking tab to release the controller from the cradle. The cradle also has an electronically controlled lock which locks and unlocks the button from being actuated to release the controller. The electronically controlled lock is controlled by a printed circuit board (PCB) attached to a support structure on the bottom of the cradle. The PCB activates the electronically controlled lock in response to a lock/unlock control signal from a crew management terminal. As the cradle and support structure for the PCB are integrated, the cradle and PCB are not separable to provide multiple mounting options. In addition, releasing the controller from the cradle requires manually actuating button, and therefore the cradle cannot fully release the controller electronically.

SUMMARY

In one embodiment, the present invention is directed to an innovative docking cradle for a handheld computing device, such as a remote controller or tablet computer. The docking cradle can mount to a vertical mounting surface or a horizontal mounting surface, and in either case, the computing device is in substantially the same orientation for convenient use and access by a user. In addition, the docking cradle can completely lock and unlock the computing device in the cradle electronically in response to a lock/unlock control signal from a central computerized management system. In another aspect, the docking cradle is mountable at a passenger seat of a passenger vehicle, as part of an onboard entertainment system. The passenger vehicle may be of any type having a plurality of passenger seats, including a commercial airplane, train, trolley, bus, ship, ferry, automobile, truck, etc.

The docking cradle includes a cradle assembly and a separate electronic box assembly. The electronic box assembly is configured to be mounted to a mounting structure at the passenger seat, such as to a seat back, table, or other suitable structure. The cradle assembly attaches to the electronic box assembly. The cradle assembly comprises a cradle housing having a front side, a bottom side, a top side and a back side. The front side of the housing has a slot for slidably receiving the computing device and holding the computing device in a substantially vertical orientation so that the computing device is conveniently viewable and accessible to a user.

The electronic box assembly includes an enclosure and an electronic module contained within the enclosure. The electronic module may include electronics for operating an electronic, motorized latch assembly in the cradle assembly for locking/unlocking the handheld computing device in the docking cradle. In particular, wiring connects the electronics in the electronic box assembly to the motorized latch assembly in the cradle assembly. The enclosure has a first side and a second side opposing the first side such that the electronic module is disposed between the first side and second side.

The electronic module may include a PCB and other electronics. The electronic box assembly also has a horizontal mounting flange attached to and extending outward substantially perpendicularly from the first side. The horizontal mounting flange is for attaching the cradle assembly to the electronic box assembly in a horizontal mount configuration in which electronic box assembly is mounted to a mounting structure with the first side being oriented substantially horizontally. The electronic box assembly also has a vertical mounting flange attached to and extending upward substantially parallel to the first side. The vertical mounting flange is for attaching the cradle assembly to the electronic box assembly in a vertical mount configuration in which the electronic box assembly is mounted to a mounting structure with the first side being oriented substantially vertically.

Accordingly, the docking cradle has two different mounting configurations, referred to as a horizontal mount and a vertical mount, based upon the orientation of the mounting structure to which the docking cradle is mounted and the orientation of the electronic box assembly as mounted to the mounting structure. In the horizontal mount, the electronic box would typically be mounted to a horizontal mounting structure (e.g., a table), and in the vertical mount, the electronic box would typically be mounted to a vertical mounting structure (e.g., a seat back or vehicle wall).

In the horizontal mount configuration, the electronic box assembly is configured for mounting to a horizontal mounting structure with the first side of the electronic box oriented substantially horizontally. The cradle assembly is attached to the electronic box assembly with the cradle housing sitting on top of the first side of the enclosure such that the bottom of the cradle housing rests on the first side of the enclosure.

In the vertical mount configuration, the electronic box assembly is configured for mounting to a vertical mounting structure with the first side of the electronic box oriented substantially vertically. The cradle assembly is attached to the electronic box assembly with the first side of the enclosure of the electronic box assembly bearing against the back side of the cradle housing.

In another aspect of the docking cradle, in the horizontal mount configuration, the horizontal mounting flange is attached to the back side of the housing using one or more fasteners. Furthermore, the vertical mounting flange may bear against the bottom side of the cradle housing.

In still another aspect, in the vertical mount configuration, the vertical mounting flange is attached to the back side of the housing using one or more fasteners. In addition, the horizontal mounting flange may bear against the bottom side of the cradle housing.

In another feature, the cradle assembly may further comprise a cradle connector which connects to a computing device connector on the computing device when the computing device is installed in the slot in order to provide a conductive electrical connection between the computing device and the docking cradle. In another aspect, the cradle connector may be a spring-loaded pin connector, such as a POGO style connector.

In still another feature of the docking cradle, the cradle assembly may also include a motorized latch assembly configured to releasably lock the computing device into the slot. In yet another aspect, the motorized latch assembly may include: a motor coupled to a drive shaft; a cam disposed on the drive shaft; and a latch coupled to the cam such that rotation of the cam moves the latch between a locked position and an unlocked position. In the locked position, the latch engages a detent of the computing device locking the computing device into the slot. In the unlocked position, the latch is disengaged from the detent thereby allowing the computing device to be removed from the slot. The motorized latch assembly may also have a biasing device (e.g., a spring) which biases the latch toward the locked position.

In another feature, the motorized latch assembly may be operably coupled to, and controllable by, a central management computer system. For instance, the motorized latch assembly may be connected to the electronic module which is in turn connected to the central management computer system.

In another aspect, the cradle assembly includes a wireless communication module configured to wirelessly communicate with the computing device. For instance, the wireless communication module may be utilized to communicate with the computing device when the computing device is removed from the slot such that it is not connected to the conductive cradle connector.

In still another aspect, the docking cradle may be utilized in an onboard entertainment system on a passenger vehicle, such as an IFE. The docking cradle is mounted to a support structure of the vehicle. The docking cradle is operably coupled to an in-seat video display system and/or an entertainment system server. For example, the electronics module of the docking cradle may be operably connected to the in-seat video display system such that the computing device can receive inputs from a user to control the video display system and/or other seat functions, and send control signals to the video display system to control the video display system and/or other seat functions. The docking cradle and computing device may also be configured to receive media content from the entertainment system server (e.g., via the video display system) to play the media content on the computing device, such that the computing device is an auxiliary video monitor to a main video monitor of the video display system.

BRIEF DESCRIPTION OF THE DRAWINGS

The foregoing and other aspects of embodiments are described in further detail with reference to the accompanying drawings, wherein like reference numerals refer to like elements and the description for like elements shall be applicable for all described embodiments wherever relevant.

DETAILED DESCRIPTION

Figure 1:
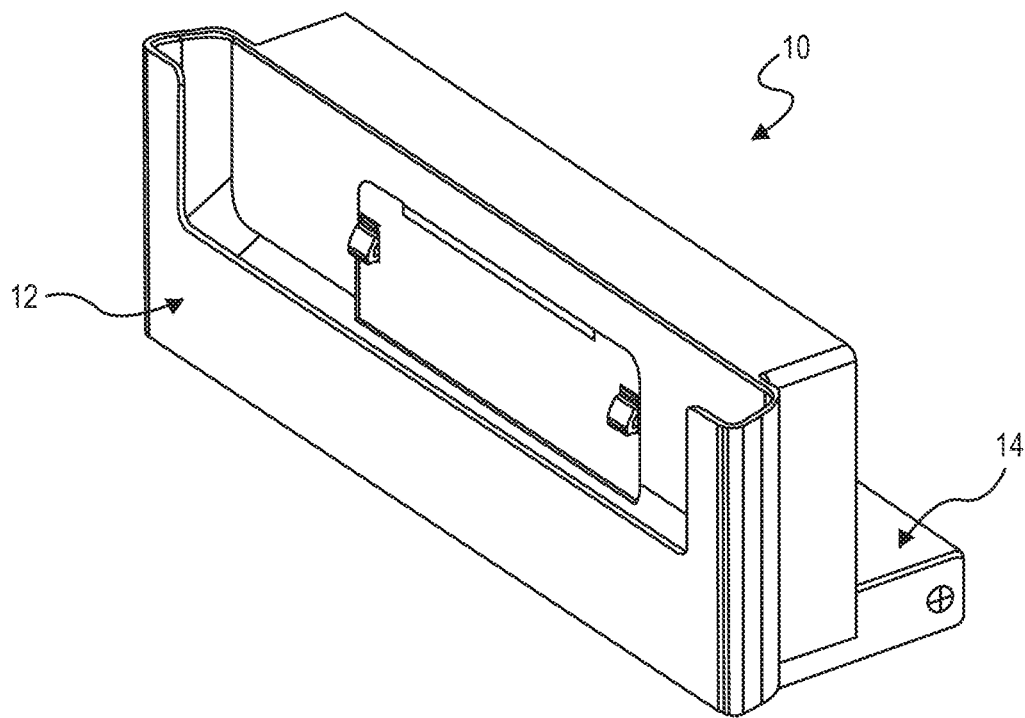
FIG. 1 is a front, perspective view of a docking cradle for a handheld computing device, in a horizontal mount configuration, according to one embodiment.

The present invention is directed to an innovative docking cradle for a handheld computing device. The handheld computing device may be any suitable electronic device, such as a handheld controller, remote control, tablet computer, smartphone or other electronic device. For example, the handheld computing device may be a tablet computer which is configured as a remote control for a video display unit of an onboard entertainment system (e.g., an IFE system) of a passenger vehicle. In one feature, the docking cradle is configured to be mountable to a horizontal mounting surface (e.g., a table or other horizontal surface), or a vertical mounting surface (e.g., a seatback or wall), while in either mounting orientation, the docking cradle holds the computing device in substantially the same orientation for convenient use and access by a user. For instance, the docking cradle may hold the computing device in a vertical orientation, a substantially vertical orientation, or a small angle away from vertical, such that a display monitor and/or input device of the computing device is easily viewed by the user and accessible by the user while the computing device is installed in the docking cradle. In this way, the user can conveniently use the computing device while it is installed in the docking cradle. In addition, the docking cradle has an electronic locking mechanism to lock and unlock the computing device in the cradle from a central management computer system.

Although the embodiment described herein may be used in an onboard entertainment system by mounting the docking cradle at a passenger seat, the docking cradle is not limited to such installations, but can be utilized in any suitable application, such as in schools, libraries, public spaces, etc., where it is useful to be able to dock a handheld computing device and be capable of locking and unlocking the device in the docking cradle.

Referring to FIGS. 1-6, one embodiment of a docking cradle 10 for holding a handheld computing device 80 (see FIGS. 16 and 17) is illustrated. The docking cradle 10 comprises two main components, namely, a cradle assembly 12 and an electronic box assembly 14. The docking cradle 10 is removably attachable to the electronic box assembly 14 using a plurality of fasteners 16, such as screws 16. As depicted in FIGS. 1-6, the docking cradle 10 has two different assembly configurations between the cradle assembly 12 and the electronic box assembly 14.

Figure 2:
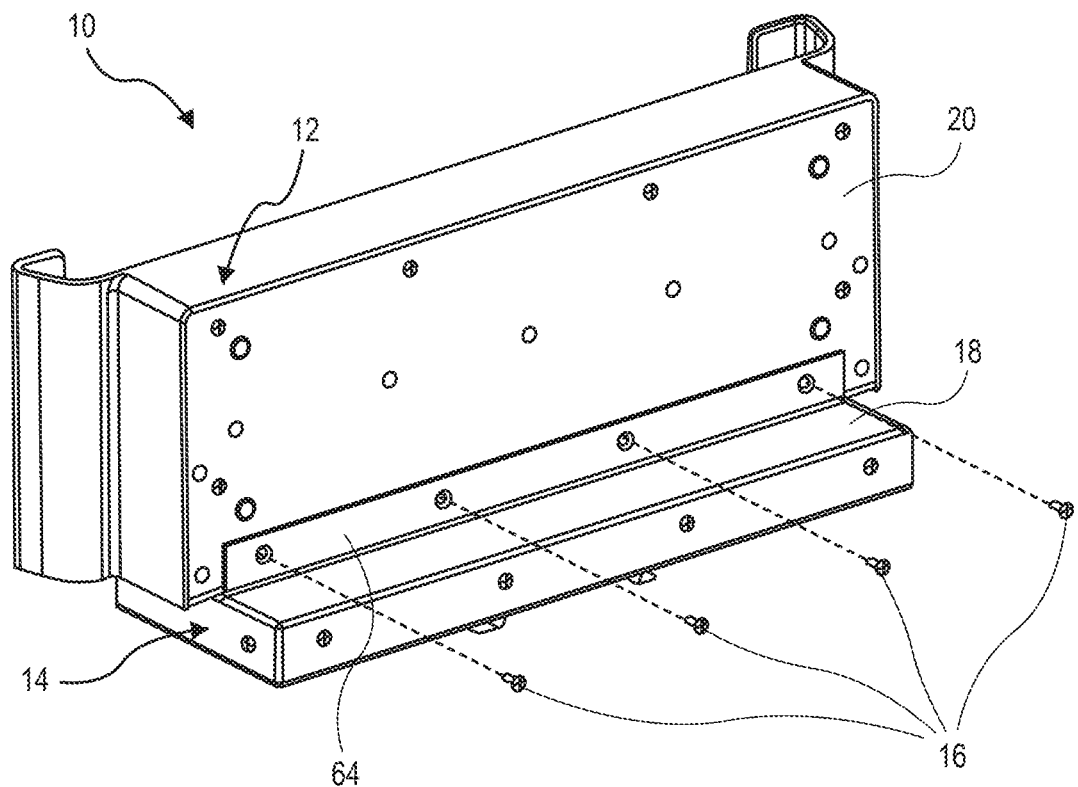
FIG. 2 is a rear, perspective view of the docking cradle of FIG. 1, in a horizontal mount configuration, according to one embodiment.
Figure 3:
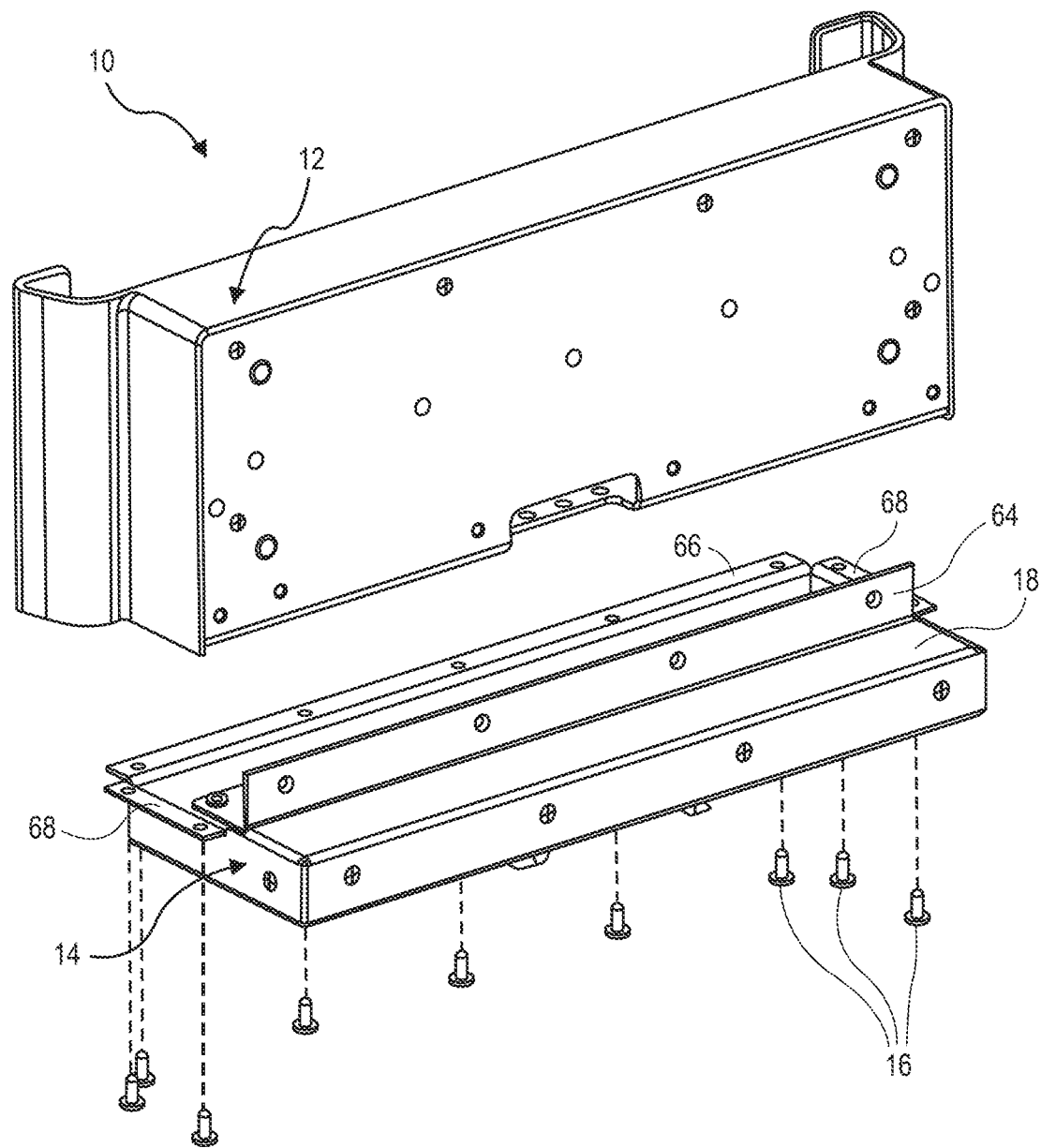
FIG. 3 is a rear, perspective, exploded view of the docking cradle of FIG. 1, in a horizontal mount configuration, according to one embodiment.

As shown in FIGS. 1-3, in a first configuration, referred to as a horizontal mount configuration (or horizontal mount), electronic box assembly 14 is configured to be mounted to a substantially horizontal mounting surface, such as a table, with a first side 18 of the electronic box assembly 14 oriented in a substantially horizontal orientation. The cradle assembly 12 is attached to the electronic box assembly 14 with the cradle assembly 12 sitting on top of the first side 18.

Figure 4:
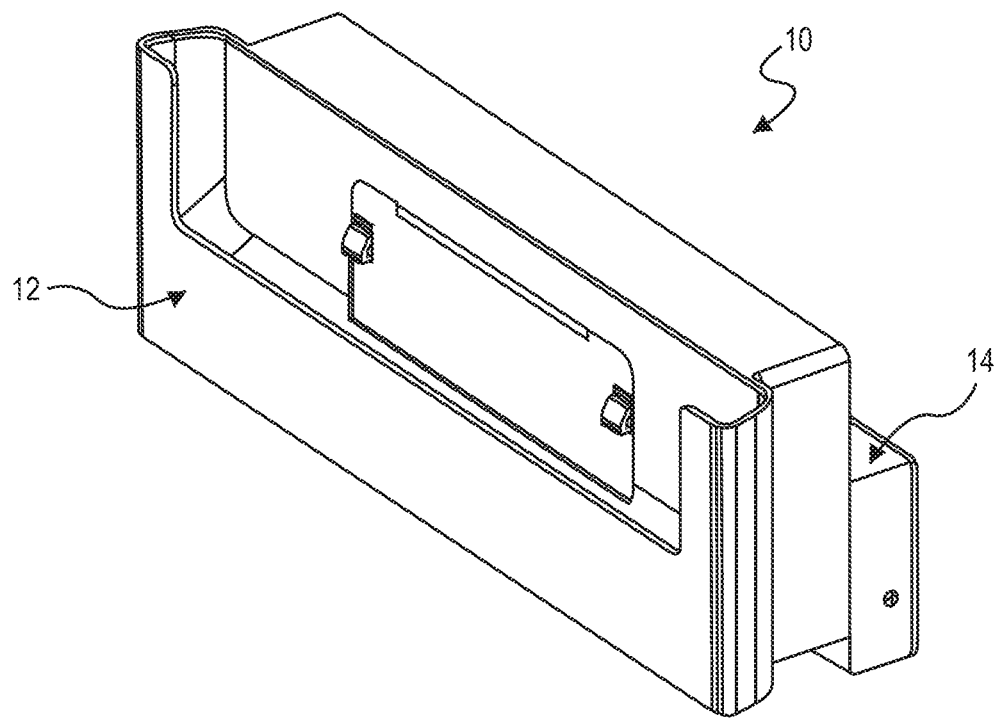
FIG. 4 is a front, perspective view of the docking cradle of FIG. 1, in a vertical mount configuration, according to one embodiment.
Figure 5:
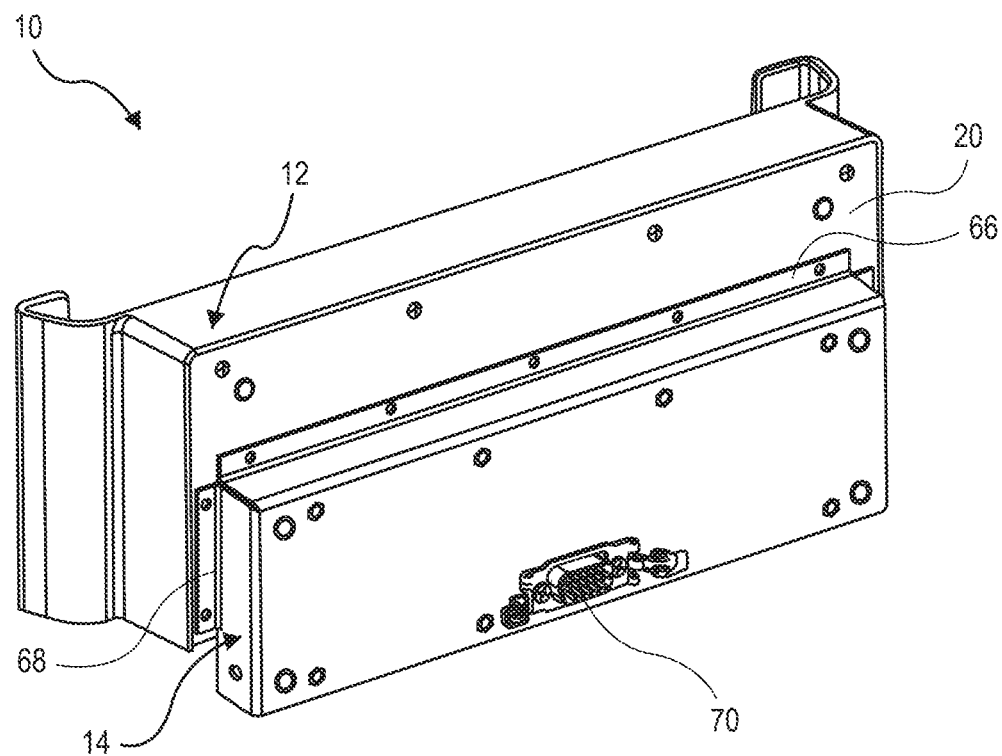
FIG. 5 is a rear, perspective view of the docking cradle of FIG. 1, in a vertical mount configuration, according to one embodiment.
Figure 6:
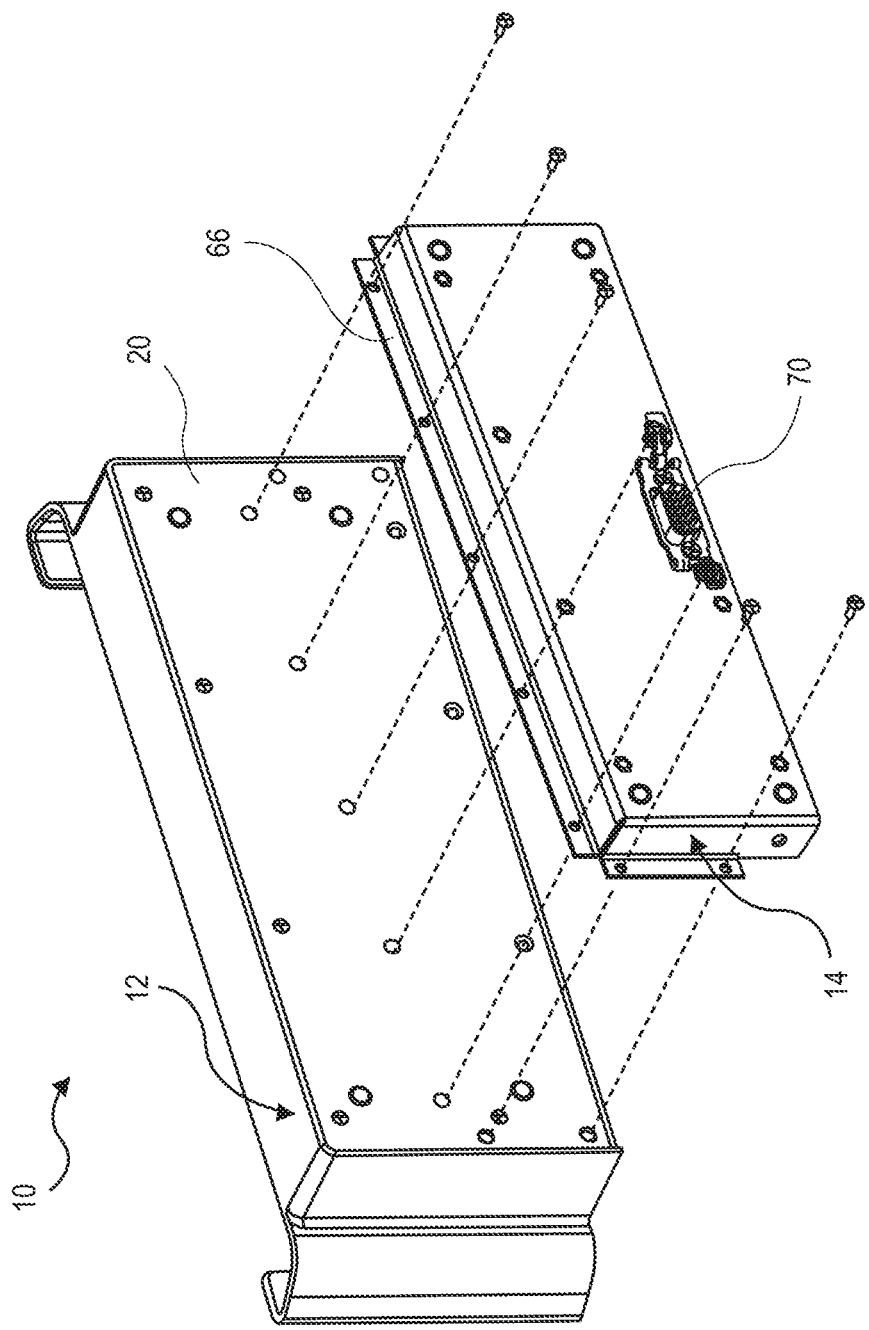
FIG. 6 is a rear, perspective, exploded view of the docking cradle of FIG. 1, in a vertical mount configuration, according to one embodiment.
Figure 7:
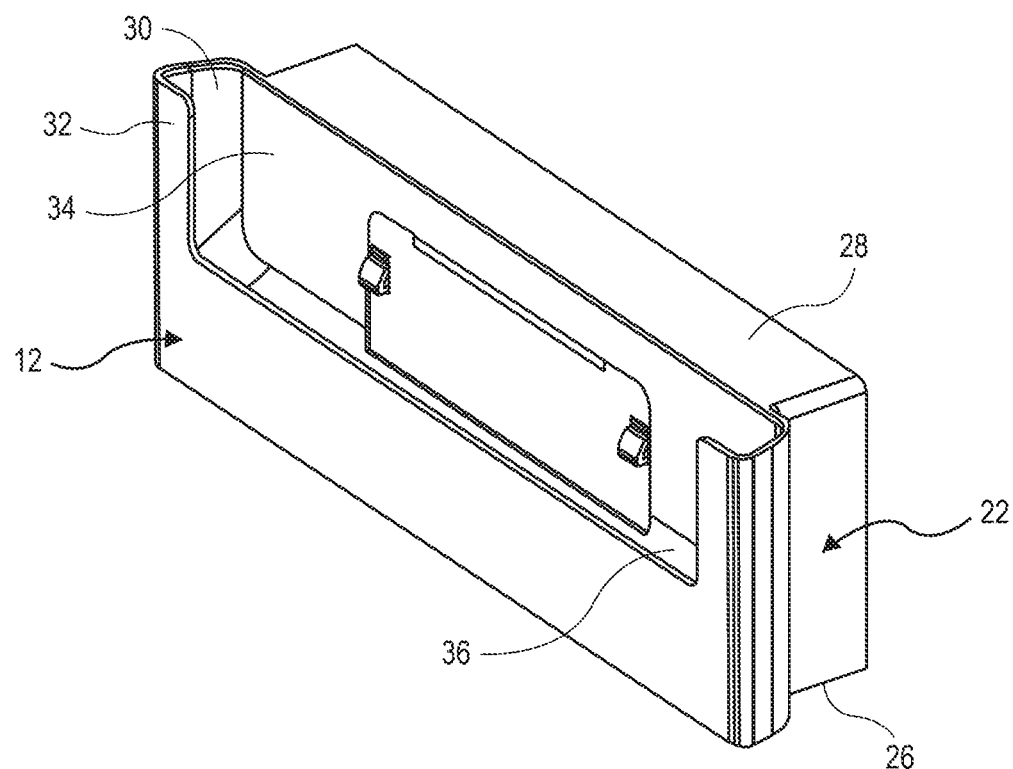
FIG. 7 is a front, perspective view of the cradle assembly of the docking cradle of FIG. 1, according to one embodiment of the present invention.
Figure 8:
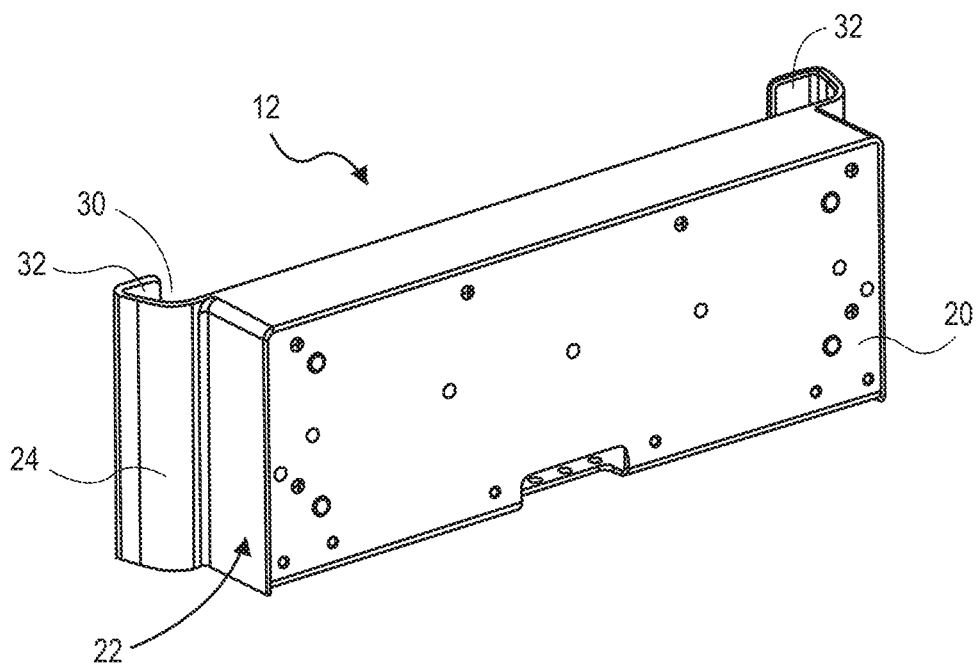
FIG. 8 is a rear, perspective view of the cradle assembly of the docking cradle of FIG. 1, according to one embodiment of the present invention.

As shown in FIGS. 4-6, in a second configuration, referred to as a vertical mount configuration (or vertical mount), the electronic box assembly 14 is configured to be mounted to a substantially vertical mounting surface, such as a seatback or wall, with the first side 18 of the electronic box assembly 14 oriented in a substantially vertical orientation. The cradle assembly 12 is attached to the electronic box assembly 14 with the first side 18 of the electronic box assembly bearing against the back side 20 of the cradle assembly 12.

In this way, the narrower dimension of the electronic box assembly 14 extends away from the mounting surface in both the horizontal mount and the vertical mount, resulting in an overall more compact installation.

Figure 9:
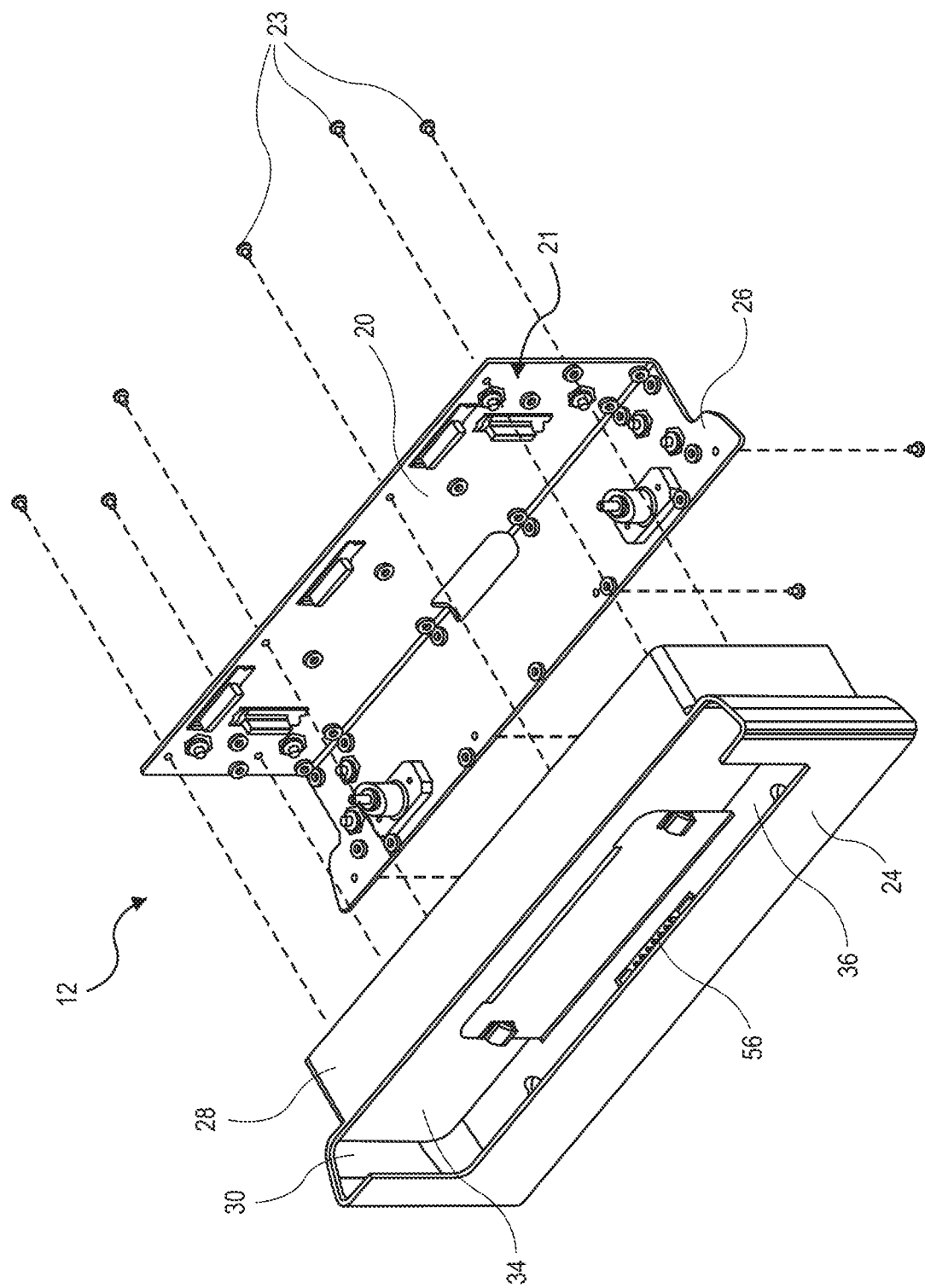
FIG. 9 is a front, perspective, exploded view of the cradle assembly of the docking cradle of FIG. 1, according to one embodiment of the present invention.

Turning to FIGS. 7-11, the cradle assembly 12 includes a cradle housing 22 which forms the main structure of the cradle assembly 12. The cradle housing 22 has a front side 24, a bottom side 26, a top side 28 and a back side 20. As shown in FIG. 9, in the disclosed embodiment, the bottom side 26 and back side 20 may be an integral part which is removable from the front side 24 such that it forms a cover 21 of the cradle housing 22. The cover 21 may attach to the front side 24 using a plurality of fasteners 23. The front side 24 has a slot 30 for slidably receiving the computing device 80 and holding the computing device 80 in a substantially vertical orientation. The slot 30 is formed by an outer wall 32 and a parallel, spaced apart inner wall 34. The slot 30 is open at the top and has a slot bottom 36 upon which the computing device 80 rests when it is installed in the docking cradle 10.

Figure 10:
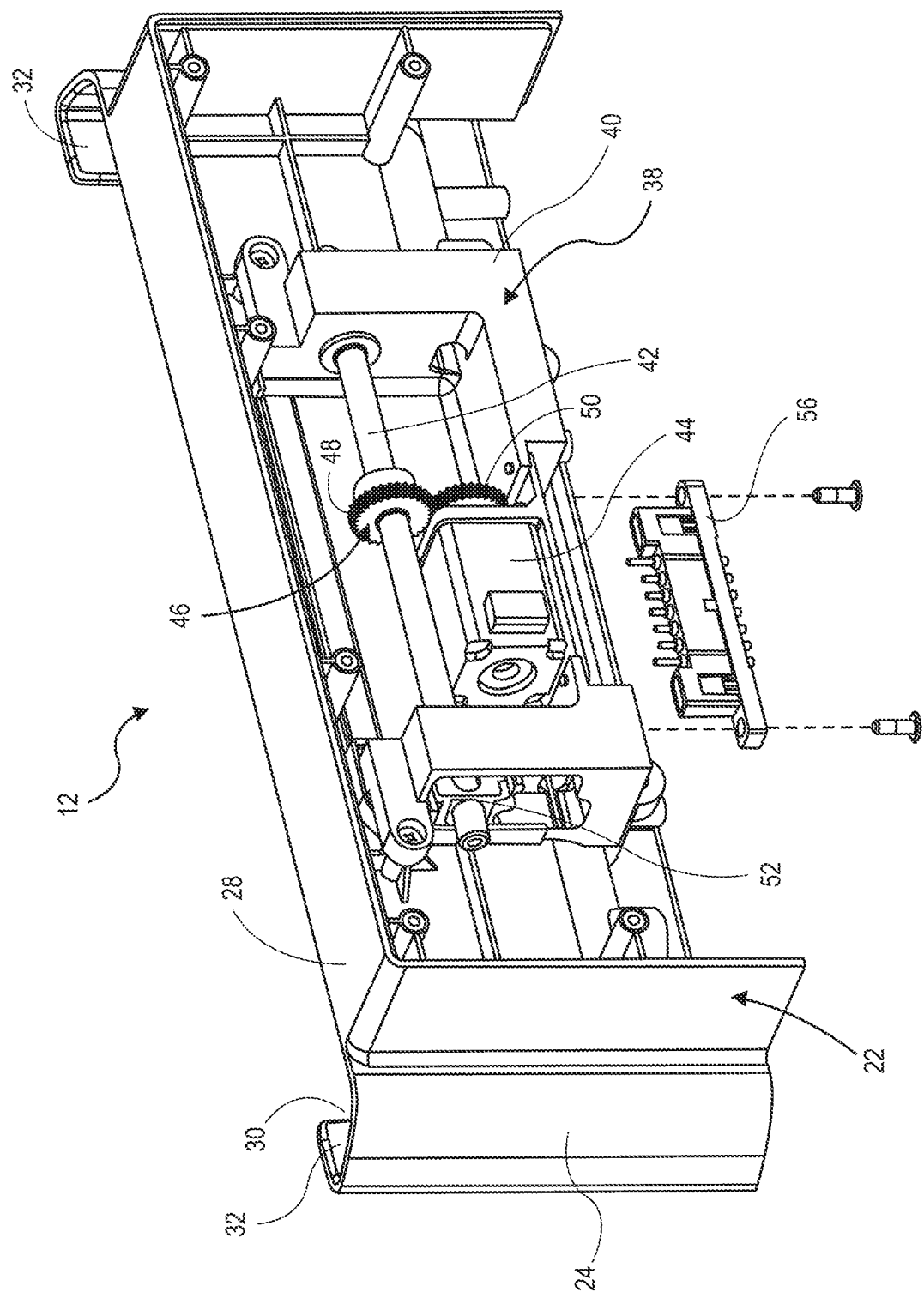
FIG. 10 is a rear, perspective, partial exploded view of the cradle assembly with the rear cover removed, according to one embodiment of the present invention.
Figure 11:
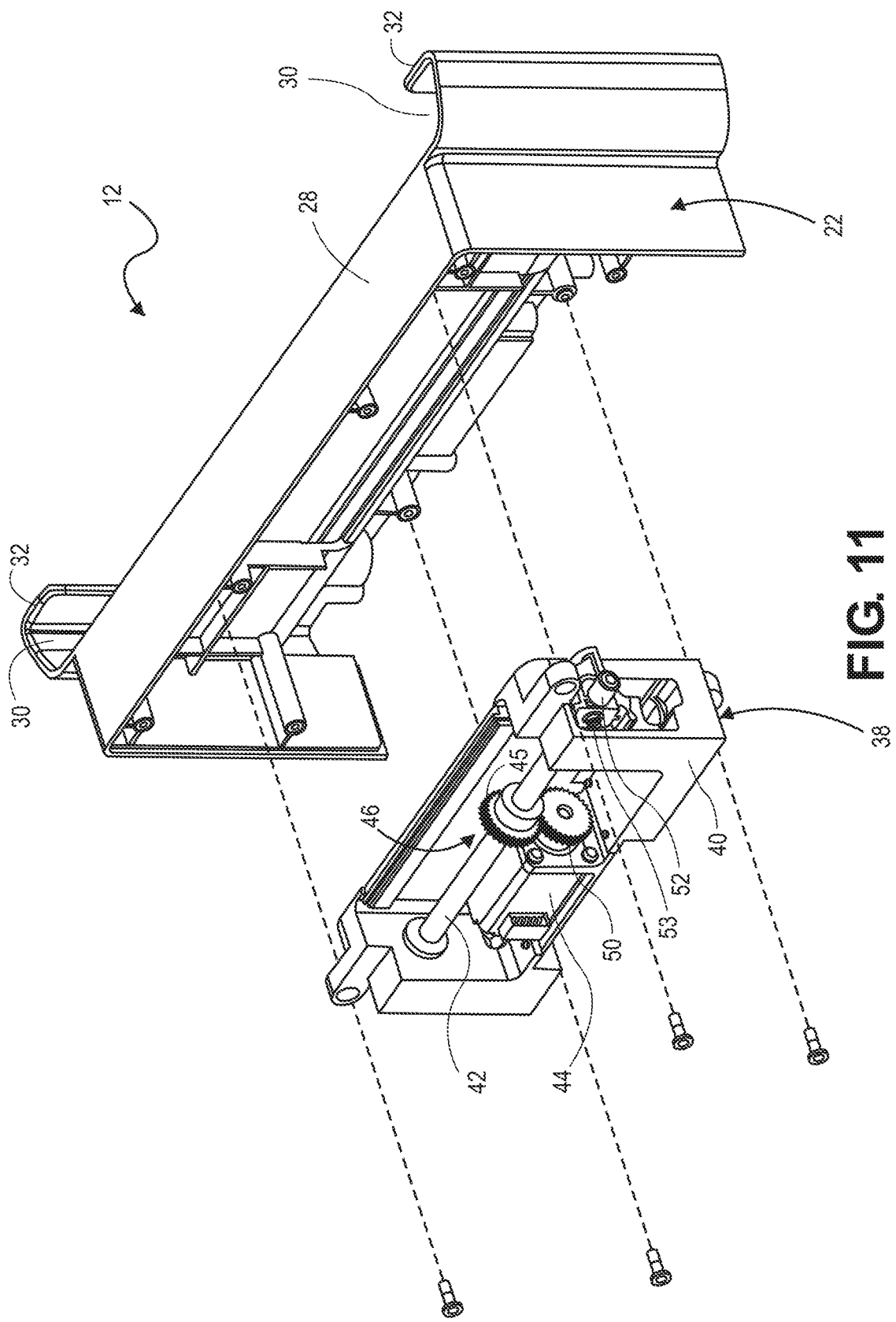
FIG. 11 is a rear, perspective, exploded view of the motorized latch assembly and front cover of the cradle assembly, according to one embodiment of the present invention.

Referring to FIGS. 10 and 11, the cradle assembly 12 also has an electronic latch assembly 38 for releasably locking and unlocking the computing device 80 in the docking cradle 10. The electronic latch assembly 38 is housed in the cradle housing 22 and mounts to the interior of the front side 24 of the cradle housing 22 using a plurality of fasteners (e.g., screws). The electronic latch assembly 38 comprises a latch frame 40. A drive shaft 42 is rotatably coupled to the latch frame 38. The latch assembly 38 has an electric motor 44 (e.g., an electric stepper motor) mounted to the latch frame 40. A gear drive 46 comprising a shaft gear 48 and a motor gear 50 couples the drive shaft 42 to the electric motor 44. Each end of the drive shaft 42 has a cam 52 which couples to a respective locking tab 54. The locking tabs 54 are moved forward and backward by the rotation of the drive shaft 42 and gear drive 46 as they are driven by the electric motor 44. The latch assembly 38 has a biasing device 53, such as a spring, which biases the locking tabs 54 toward the forward (locked) position. When in the forward position, the locking tabs 54 engage respective detents on the back of the computing device 80 when it is installed in the slot 32 thereby locking the computing device 80 in the docking cradle 10. When in the backward position, the locking tabs 54 are disengaged from the detents thereby allowing the computing device 80 to be removed from the slot 32 by sliding the computing device 80 upward and out of the slot 32. The electric motor 44 is operably coupled to an electronic motor controller on a printed circuit board (PCB) 46 in the electronic box assembly 14 (see FIGS. 12 and 14) which controls the operation of the electronic latch assembly 38. The electric motor 44 may be connected to the PCB 46 using a flex cable, or other suitable cable.

The cradle assembly 38 has a cradle connector 56 which extends through an opening in the front side 24 and bottom side 26 of the cradle housing 22. The cradle connector 56 is configured to electrically connect with a computing device connector 104 (see FIG. 16) on the computing device 80 to transmit power and data between the docking cradle 10 and the computing device 80. The cradle connector 56 may be a spring-loaded pin connector, such as a POGO style connector. The cradle connector 56 is operably coupled to the PCB 46.

Figure 12:
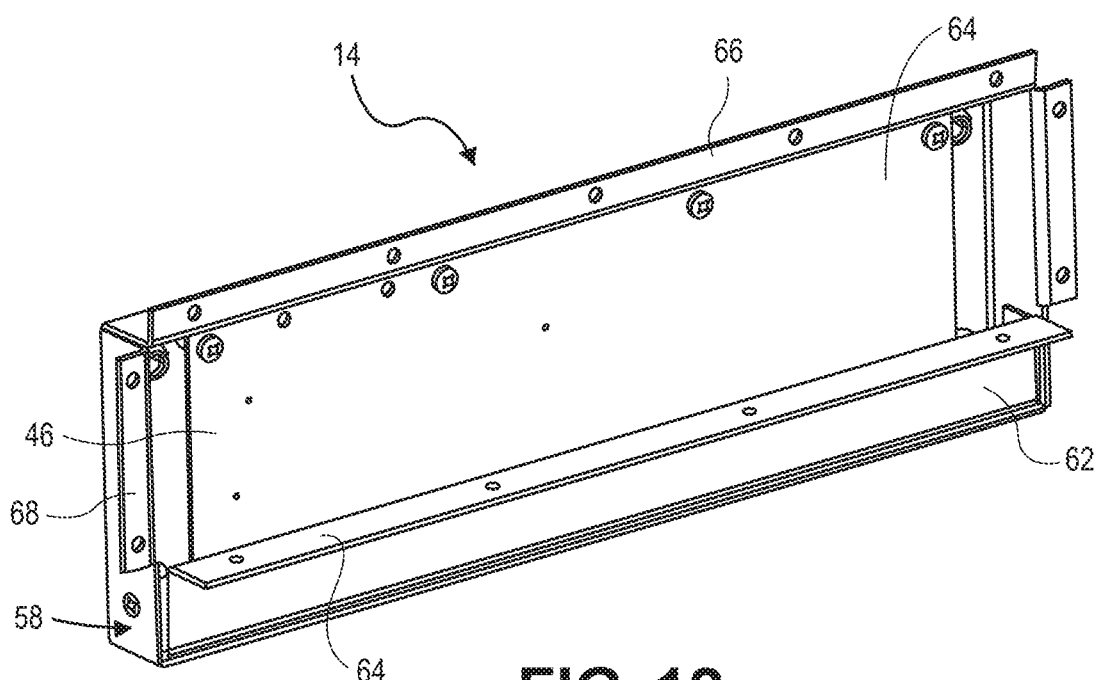
FIG. 12 is a front, perspective view of the electronic box assembly of the docking cradle of FIG. 1, according to one embodiment of the present invention.
Figure 13:
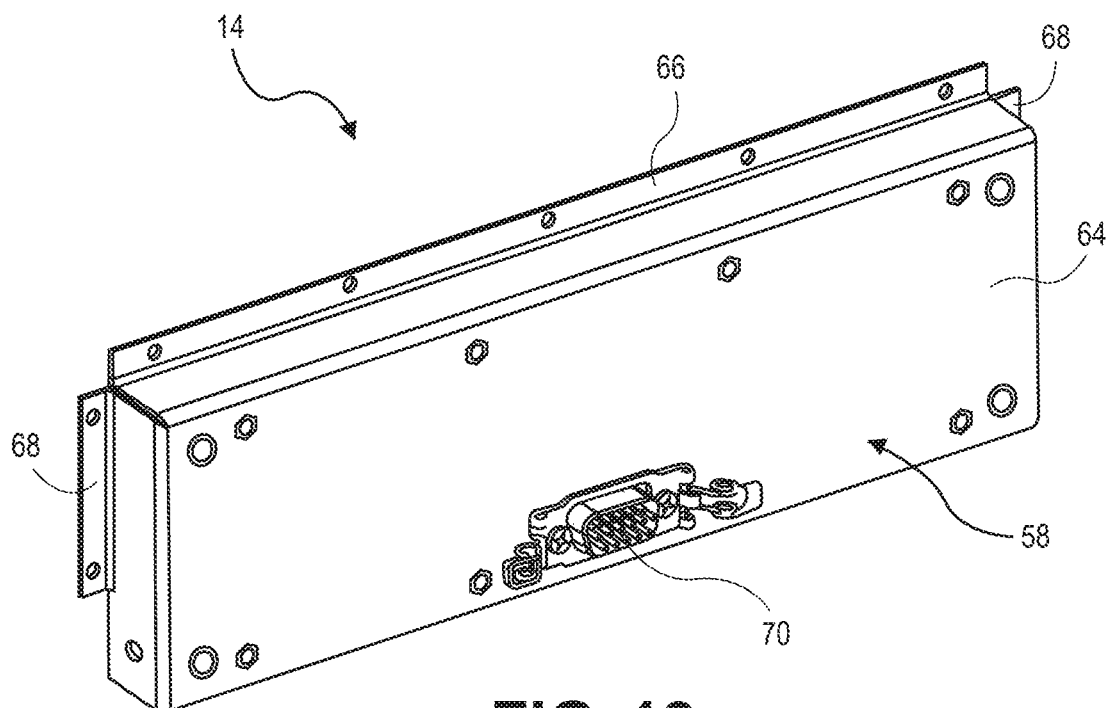
FIG. 13 is a rear perspective, view of the electronic box assembly of the docking cradle of FIG. 1, according to one embodiment of the present invention.
Figure 14:
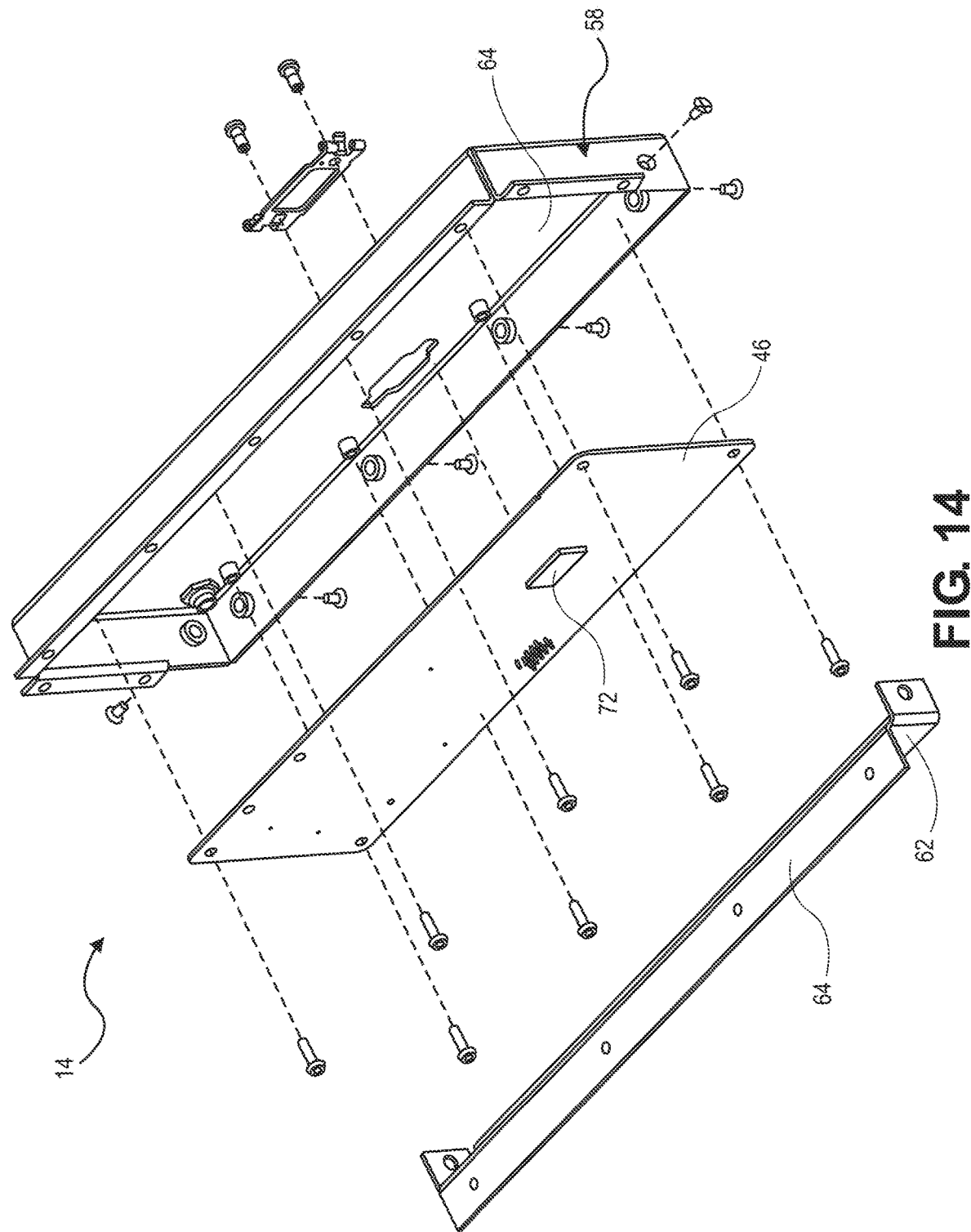
FIG. 14 is a front, perspective, exploded view of the electronic box assembly of the docking cradle of FIG. 1, according to one embodiment of the present invention.

Turning to FIGS. 12-14, the electronic box assembly 14 includes an enclosure 58 and the PCB 46 contained within the enclosure 58. The PCB 46 includes electronic components mounted on the PCB 46 for operating the latch assembly 38 and for transmitting power and data between the docking cradle 10 and a central management computer system 60 (see FIG. 17). The enclosure 58 is a rectangular box having a first side 62 and a second side 64 opposing the first side 62 with the PCB 46 disposed between the first side 62 and the second side 64. The enclosure 58 has a horizontal mounting flange 64 attached to and extending outward from the first side 62. The horizontal mounting flange 64 extends substantially perpendicularly outward from the first side 62. As shown in FIGS. 2 and 3, the horizontal mounting flange 64 is used to attach the cradle assembly 12 to the electronic box assembly 14 in the horizontal mount configuration.

The enclosure 58 also has a vertical mounting flange 66 attached to and extending upward substantially parallel to the first side 62. As shown in FIGS. 5 and 6, the vertical mounting flange 66 is used to attach the cradle assembly 12 to the electronic box assembly 14 in the vertical mount configuration.

The enclosure also has a pair of side mounting flanges 68 used to attach the cradle assembly 12 to the electronic box assembly in both the horizontal and vertical mount configurations.

As shown in FIG. 13, the electronic box assembly 14 has a computer system connector 70 for electrically connecting the locking cradle 10 to the central computer management system 60. The computer system connector 70 is operably connected to the PCB 46. A flex cable (not shown) electrically connects the PCB 46 in the electronic box assembly 14 to the cradle connector 56 and the electronic latch assembly 38 (e.g., the electronic latch assembly 38 may be electrically connected to the cradle connector 56, or it may have a separate connection to the flex cable).

The PCB 46 has a wireless communication module 72 configured to wireless communicate with the computing device 80, such as when the computing device 80 is removed from the docking cradle 10. The computing device 80 has a compatible wireless communication module 74 (see FIG. 16) for wireless communicating with the wireless communication module 72. The wireless communication modules 72 and 74 may be any suitable wireless communication modules, such as WLAN, wireless USB, WiMAX WiFi, Bluetooth, cellular phone communication, etc.

Figure 15:
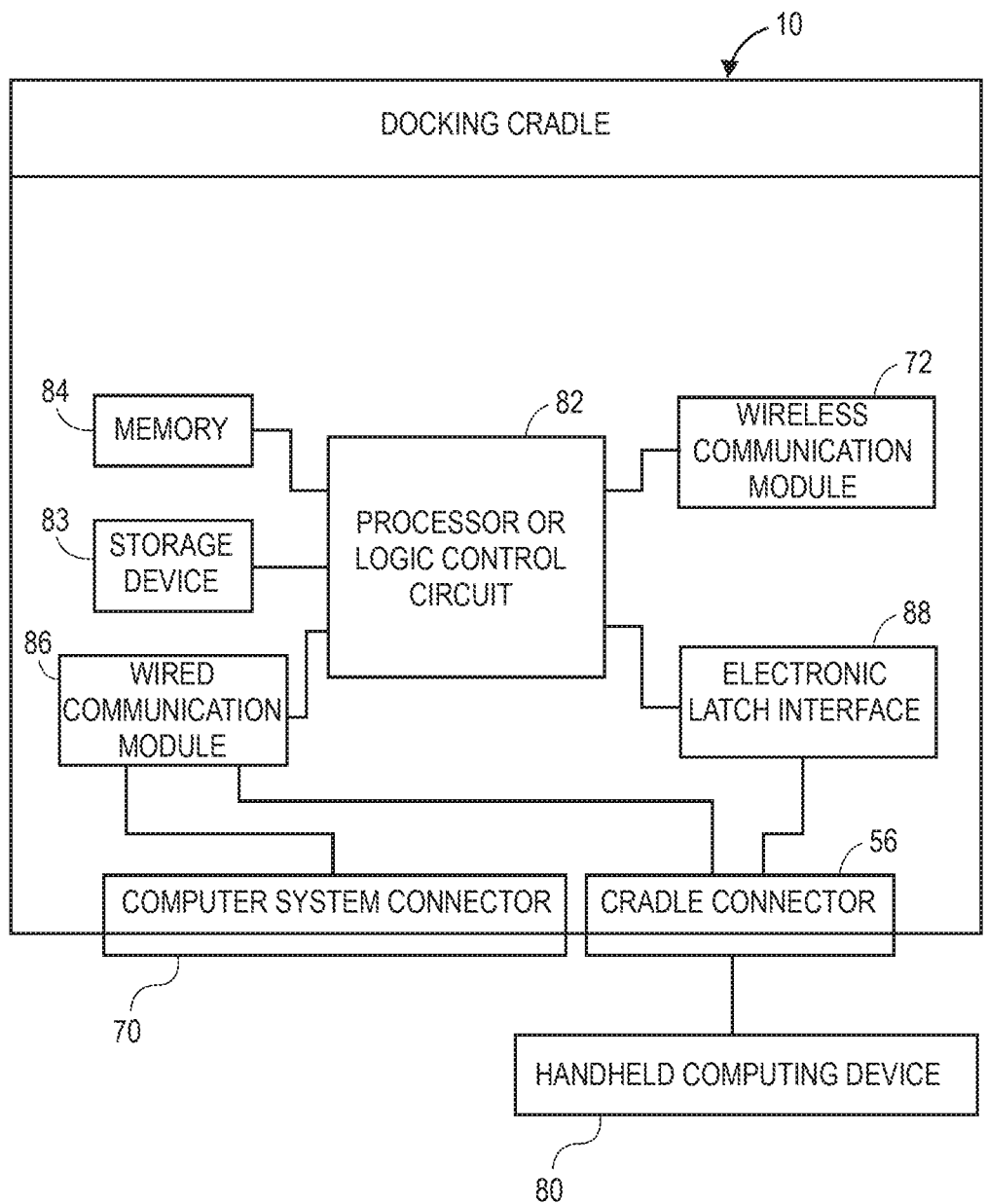
FIG. 15 is a block schematic diagram of the docking cradle of FIG. 1, according to one embodiment of the present invention.

Referring to FIG. 15, a block schematic diagram of the docking cradle 10 is illustrated. The docking cradle 10 includes a processor or logic control circuit 82. The processor or logic control circuit 82 is configured to execute computer program instructions or logic to perform the functions described herein for the docking cradle 10. The docking cradle 10 includes memory 84, a wired communication module 86 (e.g., Ethernet adapter, or other suitable network adapter), a wireless communication module 72, a storage device 83, and an electronic latch interface 88 for controlling the electronic latch assembly 38. Each of these components may be disposed and operably interconnected on the PCB 46.

Figure 16:
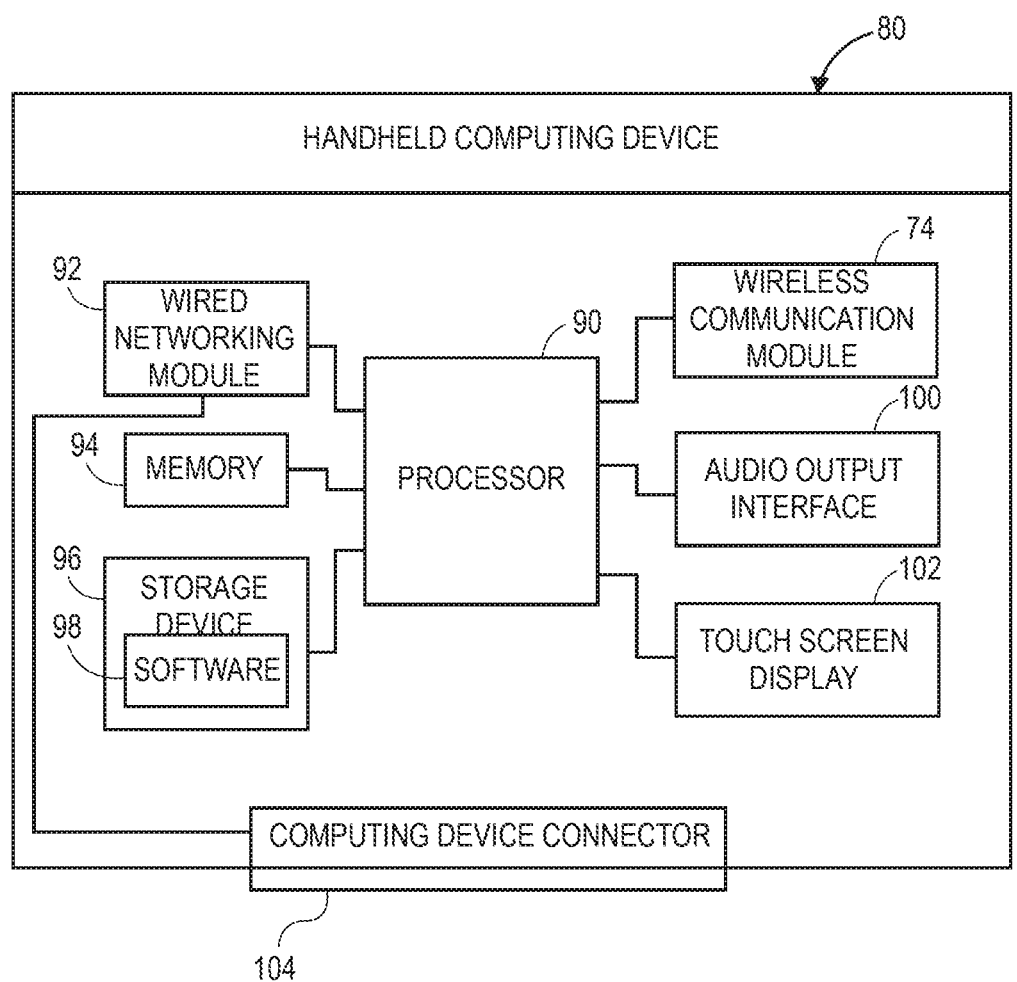
FIG. 16 is a block schematic diagram of a handheld computing device for use with the docking cradle of FIG. 1, according to one embodiment of the present invention.

Turning to FIG. 16, a block schematic diagram of an exemplary handheld computing device 80 is illustrated. The handheld computing device 80 includes a processor 90 configured to execute computer program instructions to perform the functions described herein for the computing device 80, including without limitation, functioning as a controller for: a display system of an onboard entertainment system, seat functions, and onboard communication functions, a secondary display monitor for an entertainment system, etc. The computing device 80 further includes a wired networking interface 92 (e.g., Ethernet adapter, or other suitable network adapter), memory 94, a storage device 96, system software 98 for operating the computing device 80, a wireless communication module 74 (as described herein), an audio output interface 100 and a touch screen display 102.

Figure 17:
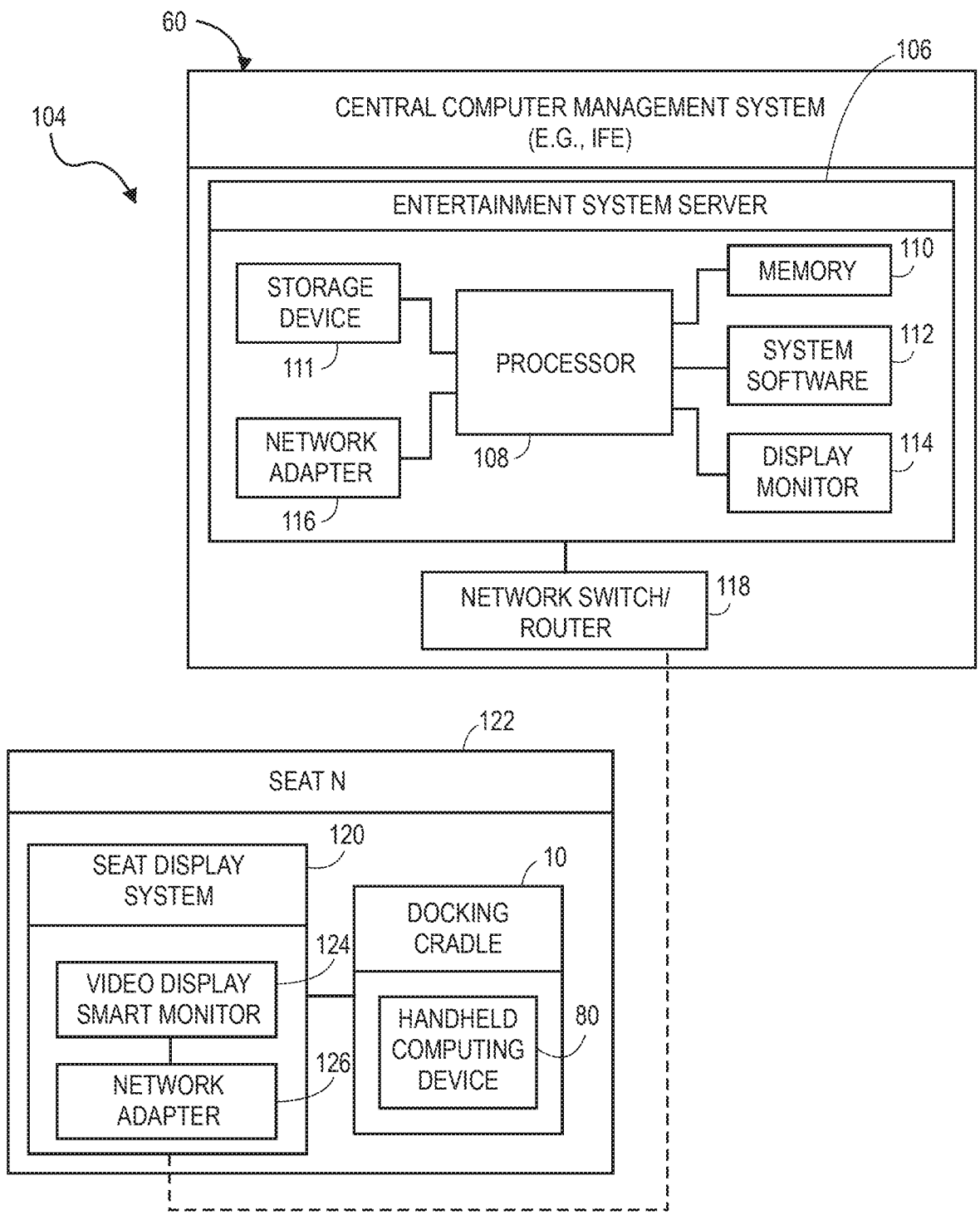
FIG. 17 is a block schematic diagram of an onboard entertainment system that includes the docking cradle and handheld computing device according to embodiments disclosed herein, according to one embodiment of the present invention.

Referring now to FIG. 17, a block schematic diagram of an exemplary onboard entertainment system 104 is illustrated. The onboard entertainment system 104 includes a central management computer system 60. The central management computer system 60 includes an entertainment system server 106. The entertainment system server 106 includes a processor 108, memory 110, a storage device 111 (e.g., for storing media such as movies, music, etc. to be distributed to each of the seat display systems 120), system software 112 for programming the processor 108 to perform the entertainment system functions, a display monitor 114 (e.g., a crew terminal), and a network adapter 116 (e.g., Ethernet adapter, or other suitable network adapter). The central computer management system 60 also has a network switch/adapter 118 for networking the central computer management system 60 to each of the N number of seat display systems 120.

Each of the plurality of passenger seats 122 (only one passenger seat 122 is shown in FIG. 17, with the understanding that the onboard entertainment system 104 includes N number of such passenger seats 122) is equipped with a seat display system 120, and a docking cradle 10 with a handheld computing device 80 installed on the docking cradle 10. The seat display system 120 includes a video display/smart monitor 124 and a network adapter 126 (e.g., Ethernet adapter, or other suitable network adapter). The network adapter 126 is in network communication with the network switch/router 118, so that each of the N number of seat display systems 120 are in network communication with the entertainment system server 106. As described herein, the docking cradle 10 and the handheld computing device 80 are also in network communication with each other and the seat display system 120.

As described herein, the central computer management system 60, seat display system 120, and docking cradle 10 are configured to allow the central computer management system 60 to actuate the electronic latch assembly 38 of the docking cradle 10 at each of the passenger seats 122 between the locked position and unlocked position by a central command from central computer management system 60. For example, a crew member can enter a lock or unlock command on the crew terminal 114. The central computer management system 60 transmits the command to the seat display system 120 at each of the affected seats 122. Each respective seat display system 120 then transmits the command to the respective docking cradle 10 which actuates the electronic latch assembly 38 in response to the command.

Although particular embodiments have been shown and described, it is to be understood that the above description is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims. For example, not all of the components described in the embodiments are necessary, and the invention may include any suitable combinations of the described components, and the general shapes and relative sizes of the components of the invention may be modified. Accordingly, embodiments are intended to exemplify alternatives, modifications, and equivalents that may fall within the scope of the claims. The invention, therefore, should not be limited, except to the following claims, and their equivalents.

What is claimed is:

1. A docking cradle for a handheld computing device, the docking cradle comprising:
a cradle assembly comprising a cradle housing having a front side, a bottom side, a top side and a back side, the front side of the cradle housing having a slot for slidably receiving the computing device and holding the computing device in a substantially vertical orientation; the cradle assembly further comprising a cradle connector which connects to a computing device connector on the computing device when the computing device is installed in the slot; and
an electronic box assembly comprising an enclosure and an electronic module contained within the enclosure, the enclosure having a first side and a second side opposing the first side such that the electronic module is disposed between the first side and second side, the electronic box assembly having a horizontal mounting flange attached to and extending outward substantially perpendicularly from the first side, and a vertical mounting flange attached to and extending upward substantially parallel to the first side;
wherein the cradle assembly and electronic box assembly are configured to be attached to each other in a horizontal mount, wherein the cradle assembly is attached to the electronic box assembly with the first side of the enclosure oriented substantially horizontally and the cradle housing sitting on top of the first side of the enclosure such that the bottom side of the cradle housing rests on the first side of the enclosure; and
wherein the cradle assembly and electronic box assembly are configured to be attached to each other in a vertical mount, wherein the cradle assembly is attached to the electronic box assembly with the first side of the enclosure oriented substantially vertically and the first side of the enclosure bears against the back side of the cradle housing.

2. The docking cradle of claim 1, wherein in the horizontal mount configuration, the horizontal mounting flange is attached to the back side of the cradle housing using one or more fasteners.

3. The docking cradle of claim 1, wherein in the vertical mount configuration, the vertical mounting flange is attached to the back side of the cradle housing using one or more fasteners.

4. The docking cradle of claim 1, wherein the cradle connector is a spring-loaded pin connector.

5. The docking cradle of claim 1, wherein the cradle assembly further comprises a motorized latch assembly configured to releasably lock the computing device into the slot.

6. The docking cradle of claim 5, wherein the motorized latch assembly comprises:
a motor coupled to a drive shaft;
a cam disposed on the drive shaft; and
a latch coupled to the cam such that rotation of the cam moves the latch between a locked position in which the latch engages a detent of the computing device thereby preventing the computing device from being removed from the slot, and an unlocked position in which the latch is disengaged from the detent thereby allowing the computing device to be removed from the slot.

7. The docking cradle of claim 6, wherein the motorized latch assembly further comprises a biasing device which biases the latch toward the locked position.

8. The docking cradle of claim 7, wherein the biasing device is a spring.

9. The docking cradle of claim 5, wherein the motorized latch assembly is operably coupled to, and controllable by, an onboard management computer system.

10. The docking cradle of claim 5, the motorized latch assembly is operably coupled to the electronic module, and the motorized latch assembly is controllable by an onboard management computer system via the electronic module.

11. The docking cradle of claim 1, wherein the electronic module comprises a printed circuit board.

12. The docking cradle of claim 1, wherein the cradle assembly comprises a cradle connector which connects to a computing device connector on the computing device when the computing device is installed in the slot, and a wireless communication module configured to wireless communicate with the computing device when the computing device is removed from the slot.

13. A docking cradle for a handheld computing device, the docking cradle comprising:
a cradle assembly comprising a cradle housing having a front side, a bottom side, a top side and a back side, the front side of the cradle housing having a slot for receiving the computing device and holding the computing device in a substantially vertical orientation, the cradle assembly comprising a cradle connector which connects to a computing device connector on the computing device when the computing device is installed in the slot and a wireless communication module configured to wirelessly communicate with the computing device when the computing device is removed from the slot;
an electronic box assembly comprising an enclosure and an electronic module contained within the enclosure, the enclosure having a first side and a second side opposing the first side such that the electronic module is disposed between the first side and second side;
wherein the cradle assembly and electronic box assembly are configured to be attached to each other in a horizontal mount, wherein the cradle assembly is attached to the electronic box assembly with the first side of the enclosure oriented substantially horizontally and the cradle housing sitting on top of the first side of the enclosure such that the bottom side of the cradle housing rests on the first side of the enclosure; and wherein the cradle assembly and electronic box assembly are configured to be attached to each other in a vertical mount, wherein the cradle assembly is attached to the electronic box assembly with the first side of the enclosure oriented substantially vertically and the first side of the enclosure bearing against the back side of the cradle housing.

14. The docking cradle of claim 13, wherein the cradle assembly further comprises a cradle connector which connects to a computing device connector on the computing device when the computing device is installed in the slot.

15. The docking cradle of claim 14, wherein the cradle connector is a spring-loaded pin connector.

16. The docking cradle of claim 13, wherein the cradle assembly further comprises a motorized latch assembly configured to releasably lock the computing device into the slot.

17. The docking cradle of claim 16, wherein the motorized latch assembly comprises:

a motor coupled to a drive shaft;

a cam disposed on the drive shaft; and a latch coupled to the cam such that rotation of the cam moves the latch between a locked position in which the latch engages a detent of the computing device thereby preventing the computing device from being removed from the slot, and an unlocked position in which the latch is disengaged from the detent thereby allowing the computing device to be removed from the slot.

18. The docking cradle of claim 17, wherein the motorized latch assembly further comprises a biasing device which biases the latch toward the locked position.

19. The docking cradle of claim 16, wherein the motorized latch assembly is operably coupled to, and controllable by, an onboard management computer system.

* * * * *